United States Patent
Chen et al.

(10) Patent No.: US 9,627,024 B2
(45) Date of Patent: Apr. 18, 2017

(54) MAGNETIC-ASSISTED NONDESTRUCTIVE SELF-REFERENCE SENSING METHOD FOR SPIN-TRANSFER TORQUE RANDOM ACCESS MEMORY

(71) Applicant: UNIVERSITY OF PITTSBURGH-OF THE COMMONWEALTH SYSTEM OF HIGHER EDUCATION, Pittsburgh, PA (US)

(72) Inventors: Yiran Chen, Pittsburgh, PA (US); Enes Eken, Pittsburgh, PA (US); Hai Li, Pittsburgh, PA (US); Wujie Wen, Pittsburgh, PA (US); Xiuyuan Bi, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 14/917,410

(22) PCT Filed: Sep. 16, 2014

(86) PCT No.: PCT/US2014/055828
§ 371 (c)(1),
(2) Date: Mar. 8, 2016

(87) PCT Pub. No.: WO2015/042033
PCT Pub. Date: Mar. 26, 2015

(65) Prior Publication Data
US 2016/0225427 A1    Aug. 4, 2016

Related U.S. Application Data

(60) Provisional application No. 61/879,699, filed on Sep. 19, 2013.

(51) Int. Cl.
*G11C 11/16* (2006.01)

(52) U.S. Cl.
CPC .......... *G11C 11/1673* (2013.01); *G11C 11/16* (2013.01); *G11C 11/161* (2013.01)

(58) Field of Classification Search
CPC .... G11C 11/16; G11C 11/161; G11C 11/1673
(Continued)

(56) References Cited

U.S. PATENT DOCUMENTS

| 7,813,168 B2 | 10/2010 | Zhu et al. |
| 7,852,665 B2 | 12/2010 | Chen et al. |

(Continued)

FOREIGN PATENT DOCUMENTS

| WO | 2005050659 A1 | 6/2005 |
| WO | 2011150170 A2 | 12/2011 |

OTHER PUBLICATIONS

G. Jeong et al., "A 0.24-um 2.0-V 1T1MTJ 16-kb Nonvolatile Magneto resistance RAM With Self-Reference Sensing Scheme", IEEE Jour. of Solid-State Circuit., vol. 38, No. 11, Nov. 2003, pp. 1906-1910.

(Continued)

*Primary Examiner* — Tan T. Nguyen
(74) *Attorney, Agent, or Firm* — Eckert Seamans Cherin & Mellott, LLC; Philip E. Levy

(57) ABSTRACT

A method of reading a memory cell of a magneto-resistive random access memory device, wherein the memory cell has a ferromagnetic free layer having a first magnetization orientation and a ferromagnetic reference layer, includes applying a first read current from the ferromagnetic free layer to the ferromagnetic reference layer and storing a first voltage generated by the memory cell in response to the first read current, generating a magnetic field adjacent to the memory cell, the magnetic field having a second magneti- (Continued)

zation orientation that is not parallel to the first magnetization orientation, while the magnetic field is being generated, applying a second read current from the ferromagnetic free layer to the ferromagnetic reference layer and storing a second voltage generated by the memory cell in response to the second read current, and determining a state of the memory cell based on the first voltage and the second voltage.

17 Claims, 4 Drawing Sheets

(58) Field of Classification Search
USPC .................... 365/158, 157, 171, 173, 189.07
See application file for complete search history.

(56) References Cited

U.S. PATENT DOCUMENTS

| | | | |
|---|---|---|---|
| 7,876,604 | B2 | 1/2011 | Zheng et al. |
| 8,116,122 | B2 | 2/2012 | Li et al. |
| 8,116,123 | B2 | 2/2012 | Chen et al. |
| 8,194,444 | B2 | 6/2012 | Zheng et al. |
| 2002/0149962 | A1 | 10/2002 | Horiguchi |
| 2010/0103729 | A1* | 4/2010 | Zhu .................... G11C 11/16 365/171 |
| 2010/0284215 | A1 | 11/2010 | Prejbeanu et al. |
| 2011/0149632 | A1 | 6/2011 | Chen et al. |

OTHER PUBLICATIONS

H. Tanizaki. "A High-density and High-speed 1T-4MTJ MRAM with Voltage Offset Self-Reference Sensing Scheme", Proc. IEEE Asian Solid-State Circuits Conference, 2006, pp. 303-306.
T. Kawahara, et al., "2Mb Spin-Transfer Torque RAM (SPRAM) with Bit-by-Bit Bidirectional Current Write and Parallelizing-Direction Current Read", Proc. IEEE International Solid-State Circuits Conference, Tech. Dig., 2007, pp. 480-617.
Y. Chen, H. Li, X. Wang, W. Zhu, W. Xu, and T. Zhang, "A Nondestructive Self-Reference Scheme for Spin-Transfer Torque Random Access Memory (STT-RAM)", Design, Automation & Test in Europe (DATE), Mar. 2010, pp. 148-153.
Y. Chen, H. Li, X. Wang, W. Zhu, W. Xu and T. Zhang, "Combined Magnetic- and Circuit-level Enhancements for the Nondestructive Self-Reference Scheme of STT-RAM", International Symposium on Low Power Electronics and Design (ISLPED), Aug. 2010, pp. 1-6.
"Everspin Throws First ST-MRAM Chips Down Launches Commercial Spin-Torque Memory Era", Available online at: http://www.engadget.com/2012/11/14/everspin-throws-first-st-rnram-chips-down/, Nov. 2012, 2 pages.
"International Technology Roadmap for Semiconductors" 2013 Edition, Available online at: http://www.itrs.net/, 2013, 51 pages.
"Samsung Global MRAM Innovation Program" Available online at: http://www.samsung.com/global/business/semiconductor/news-events/mram/, 2013, 3 pages.
Y.-C. Chen et al. "The 3-d stacking bipolar rram for high density", IEEE Transactions on Nanotechnology, vol. 11 No. 5 pp. 948-956, Sep. 2012, 9 pages.
J. Kim et al. "A Novel Sensing Circuit for Deep Submicron Spin Transfer Torque MRAM (STT-MRAM)", IEEE Transactions on Very Large Scale Integration (VLSI) Systems, vol. 20 No. 1 pp. 181-186, Jan. 2012, 6 pages.
H.-B. Lee et al. "Efficient magnetic field calculation method for pancake coil using biot-savart law", 12th Biennial IEEE Conference on Electromagnetic Field Computation, pp. 193-193, 2006, 1 page.
M. Motoyoshi et al. "A Study for 0.18 μm High-density MRAM", Symposium on VLSI Technology, pp. 22-23, 2004, 2 pages.
A. Nigam et al. "Delivering on the Promise of Universal Memory for Spin-transfer Torque RAM (STT-RAM)", International Symposium on Low Power Electronics and Design, pp. 121-126, 2011, 6 pages.
J. Z. Sun "Spin-current interaction with a monodomain magnetic body: A model study", Phys. Rev. B, vol. 62 pp. 570-578, 2000, 9 pages.
Z. Sun et al. "Voltage Driven Nondestructive Self-Reference Sensing Scheme of Spin-Transfer Torque Memory", Transactions on VLSI Systems, vol. 20 No. 11 pp. 2020-2030, 2012, 11 pages.
S. Urazhdin et al. "Noncollinear spin transport in magnetic multilayers", Phys. Rev. B, vol. 71 No. 10 pp. 100401, Mar. 2005, 4 pages.
W.-G. Wang et al. "Electric-field-assisted Switching in Magnetic Tunnel Junctions", Nature Materials, vol. 11 No. 1 pp. 64-68, Jan. 2012, 5 pages.
W. Wen et al. "PS3-RAM: A fast portable and scalable statistical STT-RAM reliability analysis method", 49th DAC, pp. 1187-1192, Jun. 2012, 6 pages.
W. Wen et al. "Loadsa: A yield-driven top-down design method for STT-RAM array", Design Automation Conference (ASP-DAC) 2013 18th Asia and South Pacific, pp. 291-296, 2013, 6 pages.
W. Wu et al. "Probabilistically Programmed STT-MRAM", IEEE Journal on Emerging and Selected Topics in Circuits and Systems, vol. 2 No. 1 pp. 42-51, Mar. 2012, 10 pages.
W. Xu et al. "Improving STT MRAM Storage Density through Smaller-Than-Worst-Case Transistor Sizing", Design Automation Conference, pp. 87-90, Jul. 2009, 4 pages.
Y. Zhang et al. "The prospect of stt-ram scaling from readability perspective", IEEE Transactions on Magnetics, vol. 48 No. 11 pp. 3035-3038, Nov. 2012, 4 pages.
Y. Zhang et al. "ADAMS: Asymmetric Differential STT-RAM Cell Structure For Reliable and High-performance Applications", International Conference on Computer-Aided Design, 2013, 8 pages.
E. Eken et al. "A new field-assisted access scheme of STT-RAM with self-reference capability," 2014 51st ACM/EDAC/IEEE Design Automation Conference (DAC), San Francisco, CA, Jun. 1-5, 2014, 6 pages.

* cited by examiner

MAGNETIC-ASSISTED NONDESTRUCTIVE SELF-REFERENCE SENSING METHOD FOR SPIN-TRANSFER TORQUE RANDOM ACCESS MEMORY

CROSS-REFERENCE TO RELATED APPLICATIONS

This application claims priority under 35 U.S.C. §119(e) from U.S. provisional patent application No. 61/879,699, entitled "Magnetic-Assisted Nondestructive Self-Reference Sensing Method for Spin-Transfer Torque Random Access Memory" and filed on Sep. 19, 2013, the contents of which are incorporated herein by reference.

GOVERNMENT CONTRACT

This invention was made with government support under grant #s CCF-1217947 and CNS-1116171 awarded by the National Science Foundation (NSF). The government has certain rights in the invention.

BACKGROUND OF THE INVENTION

1. Field of the Invention

The present invention pertains to spin-transfer torque random access memory (STT-RAM), and, in particular, to a magnetic-assisted nondestructive self-reference sensing method for STT-RAM.

2. Description of the Related Art

Demand for high capacity, nonvolatile solid-state data storage devices is expanding, largely due to fast growth in the computing and handheld/communications industries. One example of such a nonvolatile solid-state data storage device is flash memory. Flash memory, however, has several drawbacks, such as slow access speed (~ms write and ~50-100 as read), limited endurance (~$10^3$-$10^4$ programming cycles), and integration difficulty in system-on-chip (SoC) applications. Flash memory (NAND or NOR) also faces significant scaling problems at 32 nm nodes and beyond.

Magneto-resistive Random Access Memory (MRAM) is another type of data storage device used for nonvolatile and universal memory. MRAM features non-volatility, fast writing/reading speed (<10 ns), almost unlimited programming endurance (>$10^{15}$ cycles), and zero standby power.

In MRAM, data is not stored as electric charge as in conventional random access memories (RAM) like dynamic random-access memory (DRAM) and static random-access memory (SRAM). Instead, in MRAM, data is stored by a number of magnetic storage elements or cells. The basic component of an MRAM is a magnetic tunneling junction (MTJ). Data storage is realized by switching the resistance of an MTJ between a high-resistance state and a low-resistance state.

More specifically, FIG. 1A is a cross-sectional schematic diagram of an illustrative MTJ memory cell 10 in the low resistance state and FIG. 1B is a cross-sectional schematic diagram of the illustrative MTJ memory cell 10 in the high resistance state. As seen in FIGS. 1A and 1B, the MTJ memory cell 10 includes as ferromagnetic free layer 12 and a ferromagnetic reference (i.e., pinned) layer 14. Ferromagnetic free layer 12 and ferromagnetic reference layer 14 are separated by an insulating barrier layer 13. A first electrode (or contact) 15 is electrically coupled to ferromagnetic free layer 12 and a second electrode (or contact) 16 is electrically coupled to ferromagnetic reference layer 14. The ferromagnetic layers 12, 14 may be made of any suitable ferromagnetic (FM) alloy such as, for example, Fe, Co, Ni, and the insulating barrier layer 13 may be made of an electrically insulating material such as, for example, an oxide material (e.g., $Al_2O_3$ or MgO). Other suitable materials may also be used. The electrodes 15, 16 electrically connect the ferromagnetic layers 12, 14 to a control circuit providing read and write currents through the ferromagnetic layers 12, 14.

The resistance across the MTJ memory cell 10, and thus the resistance state (high or low) thereof, is determined by the relative orientation of the magnetization vectors or magnetization orientations (shown by the arrows in FIGS. 1A and 1B) of the ferromagnetic layers 12, 14. The magnetization direction of the ferromagnetic reference layer 14 is pinned (fixed) in a predetermined direction while the magnetization direction of the ferromagnetic free layer 12 is free to change.

FIG. 1A illustrates MTJ memory cell 10 in the low resistance state where the magnetization orientation of ferromagnetic free layer 12 is parallel and in the same direction as the magnetization orientation of ferromagnetic reference layer 14. This is typically termed the "low" or "0" data state. FIG. 1B illustrates MTJ memory cell 10 in the high resistance state where the magnetization orientation of the ferromagnetic free layer 12 is anti-parallel and in the opposite direction of the magnetization orientation of ferromagnetic reference layer 14. This is typically termed the "high" or "1" data state.

In one known method, the state of an MTJ memory cell 10 of an MRAM is changed by using as current induced magnetic field to switch the magnetization of the MTJ. However, as the size of MTJ memory cell 10 shrinks, the switching magnetic field amplitude increases and the switching variation becomes more severe, leading to certain undesirable effects.

As an alternative method, spin polarization current can also be used to induce magnetization switching in MRAM designs. Spin-Torque Transfer RAM (STT-RAM) uses a spin polarized (bidirectional) current through the MTJ to realize the resistance switching. More specifically, switching the resistance state and hence the data state of MTJ memory cell 10 via spin-transfer occurs when a current, passing through a magnetic layer of the MTJ memory cell 10, becomes spin polarized and imparts a spin torque on ferromagnetic free layer 12 of MTJ memory cell 10. When as sufficient spin torque is applied to ferromagnetic free layer 12, the magnetization orientation of the ferromagnetic free layer 12 can be switched between two opposite directions and accordingly the MTJ memory cell 10 can be switched between the parallel state (i.e., low resistance state or "0" data state) and the anti-parallel state (i.e., high resistance state or "1" data state) depending on the direction of the current. The switching mechanism of STT-RAM is constrained locally and STT-RAM is believed to have a better scaling property than conventional MRAM.

Thus, MTJ memory cell 10 as described may be used to construct a memory device that includes multiple MTJ memory cells 10, where a data bit may be stored in each MTJ memory cell 10 by changing the relative magnetization state of free layer 12 with respect to reference layer 14 using, for example, spin polarization current. Each stored data bit can be read out by measuring the resistance of the associated MTJ memory cell 10 using various sensing (reading) schemes.

In one conventional sensing (reading) scheme, the data of an STT-RAM bit is read out by comparing the MTJ resistance to a reference value. When the MTJ resistance difference for the data "1" and "0" is large, the two resistance states of some MTJs may be all higher or lower than the reference value. As a result, the memory bits are constantly detected as "1" or "0". The accuracy of this conventional sensing scheme is significantly affected by the randomness of the reference value induced by process variations among different cells.

In another known sensing scheme, referred to as a destructive self-reference sensing scheme, the bit line (BL) voltage generated by the original data stored in an MTJ is directly compared with the BL voltage generated by a reference data (usually data "0") stored in the same MTJ. Since the reference signal is generated from the same memory bit, the process variation incurred by the bit-to-bit variations of MTJ cells is excluded from the sensing operation. Finally, the original data needs to be written back to the memory bit because it has been overwritten by the reference value, which increases costs, latency and power consumption.

Another known sensing scheme, referred to as a nondestructive self-reference sensing scheme, leverages the different sensing current dependency of the two resistance states of an MTJ without destructively writing the predetermined reference data. Both a current and a voltage driven scheme have been developed. The current-driven scheme is based on the fact that when read current increases, the resistance of the MTJ at the high resistance state decreases rapidly, while that of the MTJ at the low-resistance state decreases slightly. The voltage-driven scheme applies two different voltages on a bit line and detects the differences between the corresponding currents through the MTJ. These schemes thus exploit the difference between the R-I curve of the parallel and the anti-parallel states, and require a voltage divider which consists of two resistor of different resistance. The resistance values, as well as the sensing current ratio, must be carefully controlled for such schemes to work properly, a feature that is difficult to achieve during fabrication.

There is thus a need for an improved sensing (reading) scheme for STT-RAM devices.

SUMMARY OF THE INVENTION

In one embodiment, a method of reading a memory cell of a magneto-resistive random access memory device is provided, wherein the memory cell has a ferromagnetic free layer having a first magnetization orientation and a ferromagnetic reference layer. The method includes applying a first read current from the ferromagnetic free layer to the ferromagnetic reference layer and storing a first voltage generated by the memory cell in response to the first read current, generating a magnetic field adjacent to the memory cell, the magnetic field having a second magnetization orientation that is not parallel to the first magnetization orientation, while the magnetic field is being generated, applying a second read current from the ferromagnetic free layer to the ferromagnetic reference layer and storing a second voltage generated by the memory cell in response to the second read current, and determining as state of the memory cell based on the first voltage and the second voltage.

In another embodiment, as magneto-resistive random access memory device is provided. The device includes a memory cell having (i) a ferromagnetic free layer having a first magnetization orientation, (ii) as ferromagnetic reference layer coupled to the ferromagnetic free layer, (iii) as contact coupled to the ferromagnetic free layer, and (iv) as magnetic field generating element coupled to the contact, wherein the magnetic field generating element is structured to generate a magnetic field having a second magnetization orientation that is not parallel to the first magnetization orientation in response to as magnetic field generating current being applied to the magnetic field generating element. The device also includes a first energy storage device structured to store as first voltage generated in response to a first read current being applied to the memory cell while the magnetic field having the second magnetization orientation is not being generated and a second energy storage device structured to store a second voltage generated in response to a second read current being applied to the memory cell while the magnetic field having the second magnetization orientation is being generated.

DETAILED DESCRIPTION OF EXEMPLARY EMBODIMENTS

Figure 1A:
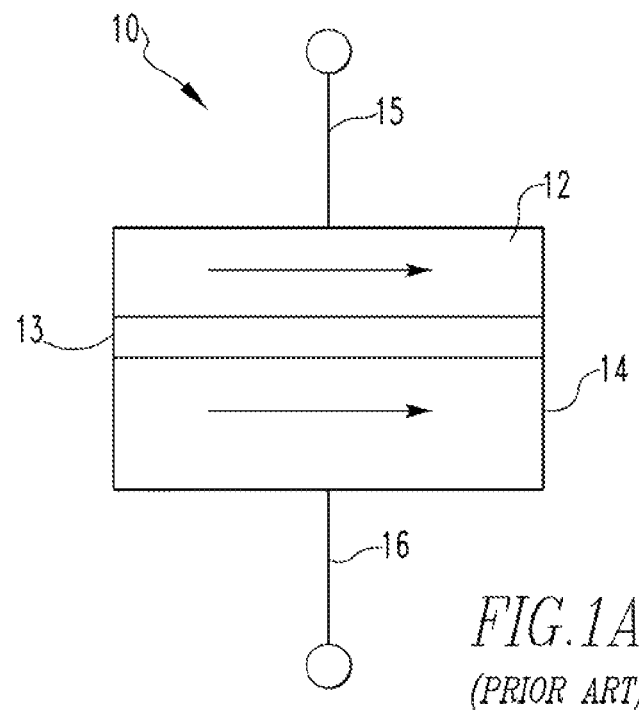
FIG. 1A is a cross-sectional schematic diagram of an illustrative prior art MTJ memory cell in a low resistance state and FIG. 1B is a cross-sectional schematic diagram of the illustrative prior art MTJ memory cell in a high resistance state.

As used herein, the singular fun of "a", "an", and "the" include plural references unless the context clearly dictates otherwise. As used herein, the statement that two or more parts or components are "coupled" shall mean that the parts are joined or operate together either directly or indirectly, i.e., through one or more intermediate pans or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the word "unitary" means is component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality).

As used herein, the terms "component" and "system" are intended to refer to a computer related entity, either hardware, is combination of hardware and software, software, or software in execution. For example, a component can be, but is not limited to being, a process running on a processor, a processor, an object, an executable, a thread of execution, a program, and/or a computer. By way of illustration, both an application running on a server and the serer can be a component. One or more components can reside within a process and/or thread of execution, and a component can be localized on one computer and/or distributed between two or more computers. While certain ways of displaying information to users are shown and described with respect to certain figures or graphs as screenshots, those skilled in the relevant art will recognize that various other alternatives can be employed. The terms "screen," "web page," and "page" are generally used interchangeably herein. The pages or screens are stored and/or transmitted as display descriptions, as graphical user interfaces, or by other methods of depicting information on as screen (whether personal computer, PDA, mobile telephone, or other suitable device, for example) where the layout and information or content to be displayed on the page is stored in memory, database, or another storage facility.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The present invention will now be described, for purposes of explanation, in connection with numerous specific details in order to provide a thorough understanding of the subject invention. It will be evident, however, that the present invention can be practiced without these specific details without departing from the spirit and scope of this innovation.

Figure 2:
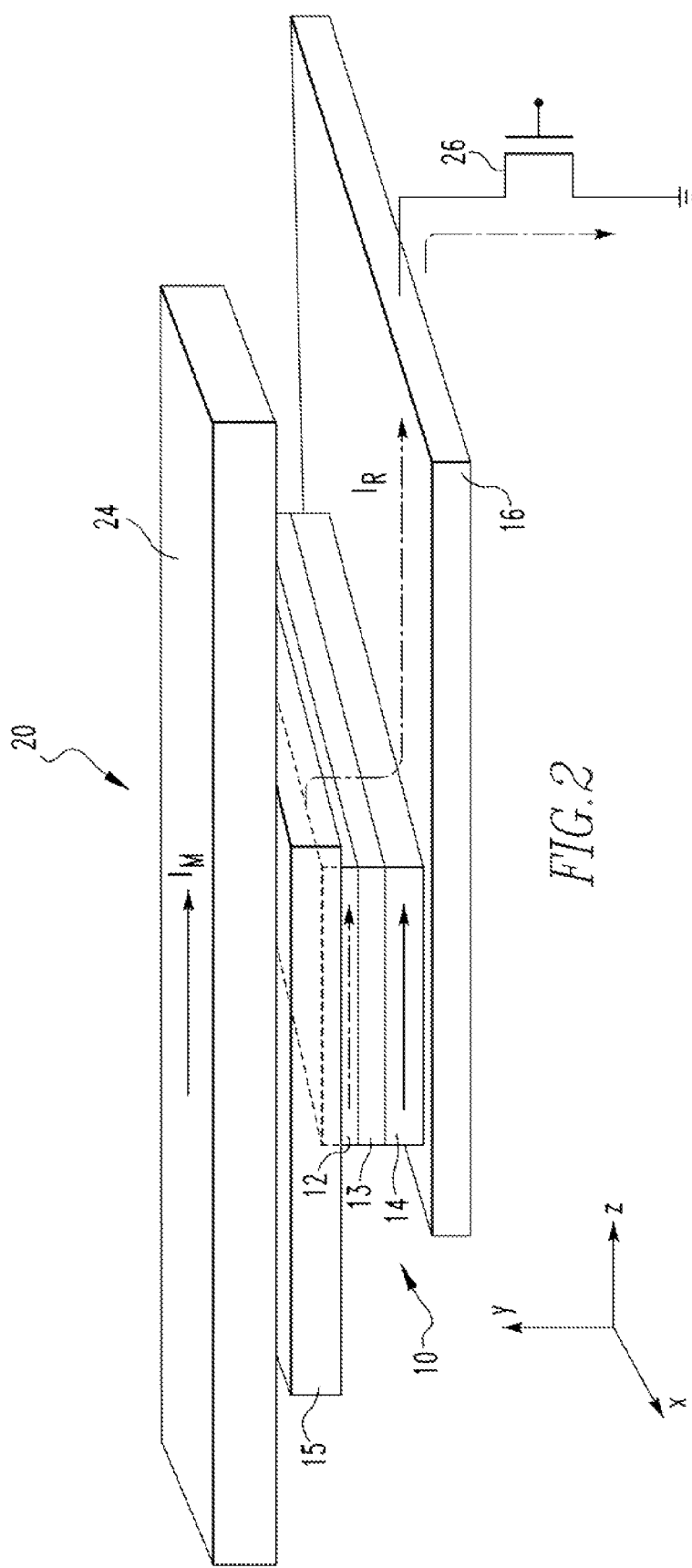
FIG. 2 is a schematic diagram of a magnetic memory unit according to one exemplary embodiment of the present invention.
Figure 3:
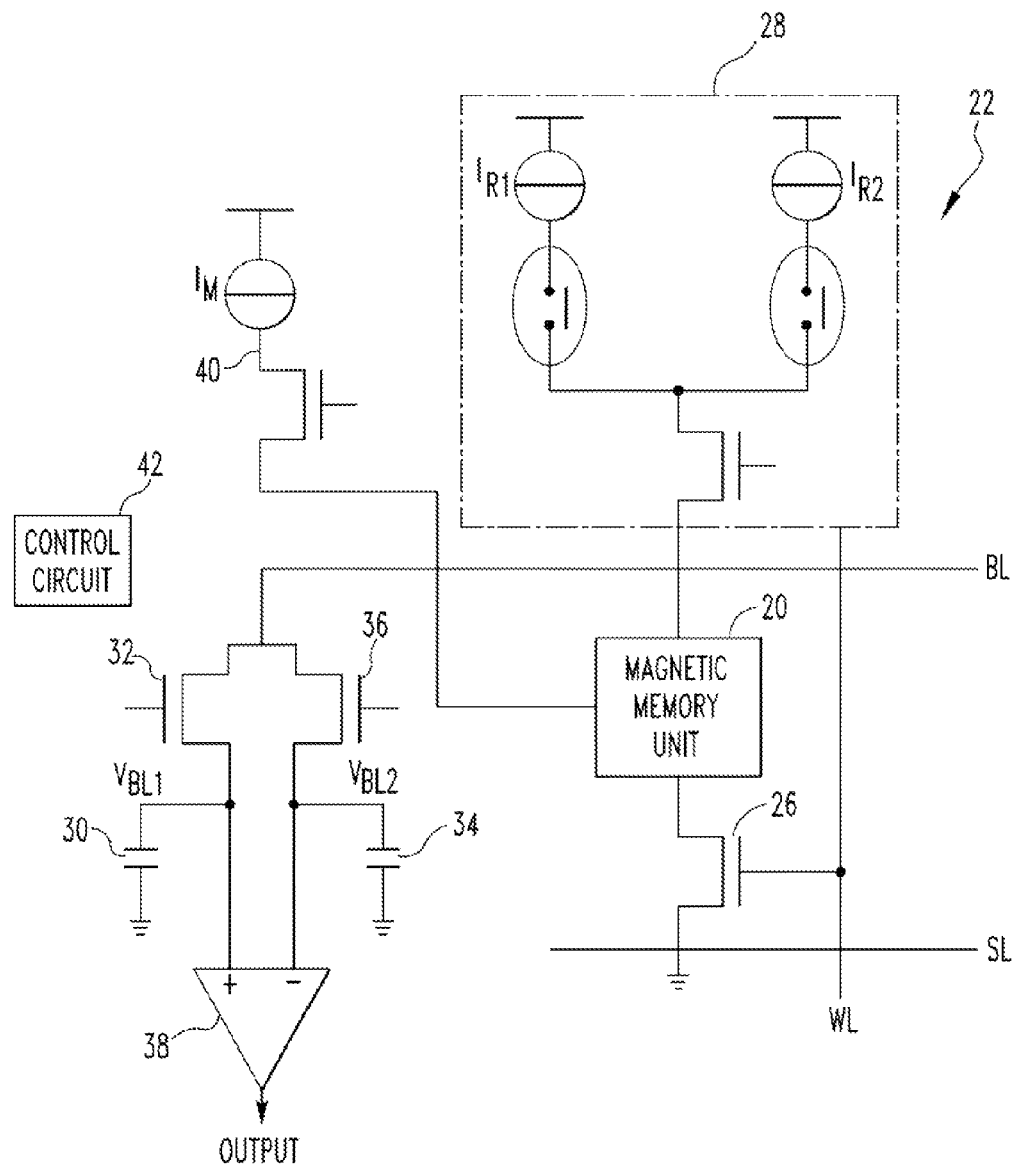
FIG. 3 is a schematic diagram of as magnetic memory apparatus according to one exemplary embodiment of the present invention which employs the magnetic memory unit of FIG. 2.

FIG. 2 is a schematic diagram of a magnetic memory unit 20 according to one exemplary embodiment of the present invention, and FIG. 3 is a schematic diagram of is magnetic memory apparatus 22 according to one exemplary embodiment of the present invention which employs the magnetic memory unit 20 of FIG. 2. A number of magnetic memory apparatuses 22 employing a number of magnetic memory units 20 as described may be used to construct a writable and readable STT-RAM device.

As seen in FIG. 2, magnetic memory unit 20 in the exemplary embodiment includes an MTJ memory cell 10. As described elsewhere herein, MTJ memory cell 10 includes contact 15, ferromagnetic free layer 12, insulating barrier layer 13, ferromagnetic reference layer 14, and contact 16. As also seen in FIG. 2, magnetic memory unit 20 further includes a magnetic field generating element 24 provided on top of contact 15 of MTJ memory cell 10. In the exemplary embodiment, magnetic field generating element 24 comprises a conductive (e.g., metal) wire or trace fabricated on top of contact 15 of MTJ memory cell 10. The function of magnetic field generating element 24 is described elsewhere herein.

As shown FIGS. 2 and 3, in magnetic memory apparatus 22, magnetic memory unit 20 is connected in series to a control transistor 26, which in the non-limiting exemplary embodiment is an N-channel MOSFET transistor. In particular, contact 16 of MTJ memory cell 10 is connected to the drain of control transistor 26, and the source of control transistor 26 is connected to ground. Control transistor 26 allows read and write current to flow through magnetic memory unit 20. The gate contact of control transistor 26 is electrically coupled to a word line WL to allow selection of the particular control transistor 26 and associated magnetic memory unit 20.

In addition, referring to FIG. 3, a first, adjustable current driver 28 is electrically coupled to the bit lie, BL, and is configured to provide a first read current $I_{R1}$ and to second read current $I_{R2}$ through magnetic memory unit 20. A first voltage storage device 30 is electrically coupled to the bit line BL through a first switch transistor 32 (the drain of first switch transistor 32 is connected to the bit line BL). First voltage storage device 30 is configured to store a first bit line voltage $V_{BL1}$ formed by the first read current $I_{R1}$. A second voltage storage device 34 is electrically coupled to the bit line BL through a second switch transistor 36 (the drain of second switch transistor 36 is connected to the bit line BL). Second voltage storage device 34 is configured to store a second bit line voltage $V_{BL2}$ formed by the second read current $I_{R2}$. In the exemplary embodiment, first voltage storage device 30 and second voltage storage device 34 are capacitors, such as, without limitation, NMOS/PMOS capacitors, MIM capacitors, and vertical natural capacitors, among others.

Furthermore, a differential sense amplifier 38 is electrically coupled to first voltage storage device 30 and second voltage storage device 34. As described elsewhere herein, differential sense amplifier 38 is configured to compare the first bit line voltage $V_{BL1}$ with the second bit line voltage $V_{BL2}$.

As seen in FIG. 3, a second current driver 40 is electrically coupled to magnetic field generating element 24 of MTJ memory cell 10. Second current driver 40 is configured to selectively provide a magnetic field generating current $I_M$ (shown in FIG. 2) to magnetic field generating element 24 (i.e., from magnetic field generating element 24 to ground), which will cause magnetic field generating element 24 to generate an external magnetic field. The generated magnetic field will be non-parallel to the magnetization orientation or direction of ferromagnetic free layer 12. In the non-limiting, exemplary embodiment, the generated magnetic field will substantially orthogonal (i.e., 87°-90°, but preferably not greater than 90°) to the magnetization orientation or direction of ferromagnetic free layer 12. The significance of this feature is described elsewhere herein.

Finally, as shown schematically in FIG. 3, magnetic memory apparatus 22 includes a control circuit 42. Control circuit 42 is configured to provide read (as described herein) and write (e.g., spin polarization current based) functionality for magnetic memory apparatus 32 in order to read data from and write data to magnetic memory unit 20. In the illustrated exemplary embodiment, control circuit 42 is operatively coupled to current drivers 28 and 40, switch transistors 32 and 36 and the output of differential sense amplifier 38 and, according to an aspect of the present invention, is structured, configured and implemented to control those components and read magnetic memory unit 20 in the manner described below in connection with FIG. 4. Control circuit 42 may be, for example and without limitation, a simple state machine or combination digital logic.

Figure 4:
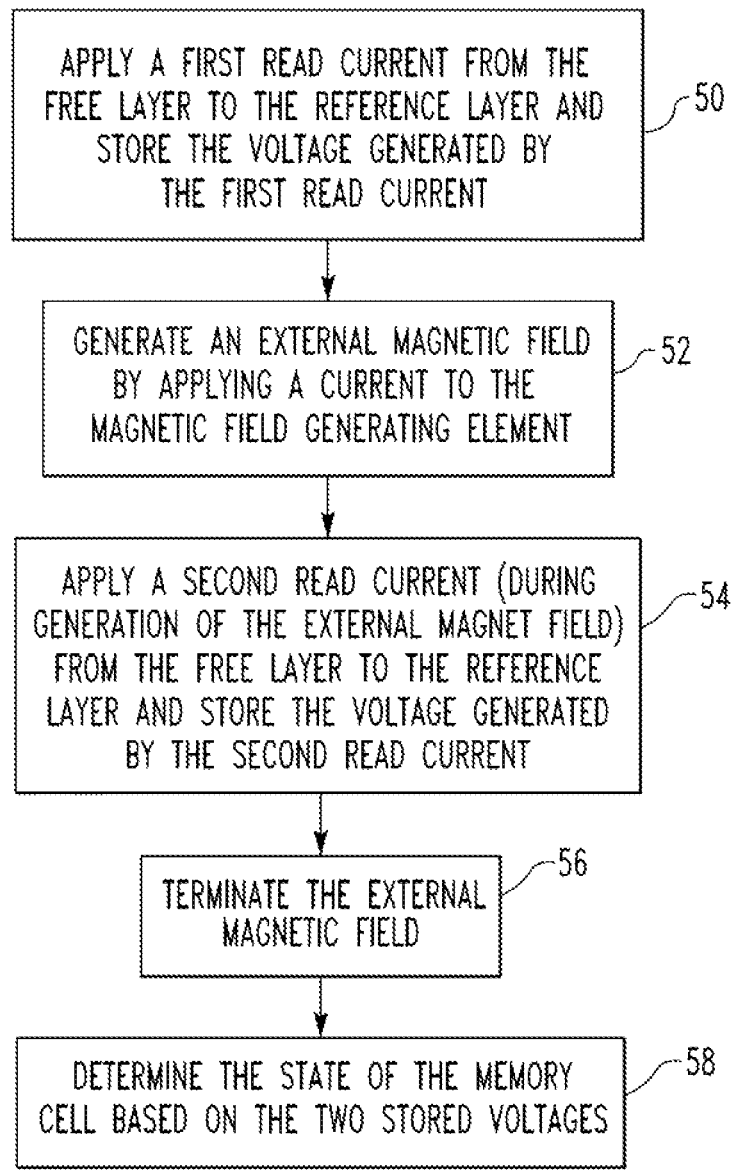
FIG. 4 is a flowchart illustrating a self-reference reading method for reading an STT-RAM cell having an MTJ (or similar structure like a spin valve) according to one embodiment of the present invention.

FIG. 4 is a flowchart illustrating a self-reference reading method for reading an STT-RAM cell having an MTJ for similar structure like a spin valve), such as magnetic memory unit 20, according to one embodiment of the present invention. As described in detail below, the disclosed method uses an external magnetic field to force the MTJ that is being read to come into an intermediate state between the parallel and anti-parallel states. The intermediate state behaves as a reference MTJ and provides a reference voltage during a read operation which is used to detect the original state of the MTJ. Following the read operation, the MTJ will go back to its original state. Thus, the method is nondestructive.

Referring to FIG. 4, the method begins at step 50, wherein control circuit 42 causes current driver 38 to apply the first read current $I_{R1}$ from ferromagnetic free layer 12 to ferromagnetic reference layer 14 of MTJ memory cell 10 of magnetic memory unit 20. At this stage, there is no external magnetic field applied, and MTJ memory cell 10 at this state is referred to as the "data state." The voltage $V_{BL1}$ generated by first read current $I_{R1}$ is stored by voltage storage device 30. First read current $I_{R1}$ may then be removed. Next, at step 52, control circuit 42 causes the magnetic field generating current $I_M$ to be applied by current driver 40 to magnetic field generating element 24. As described elsewhere herein, this will cause magnetic field generating element 24 to generate an external magnetic field which is non-parallel (e.g., without limitation substantially orthogonal) to the magnetic direction of ferromagnetic free layer 12. The non-parallel magnetic field so generated will force the magnetic direction of ferromagnetic free layer 12 to go towards 90°. However, in the exemplary embodiment, the amplitude of the magnetic field is controlled so that ferromagnetic free layer 12 cannot be fully switched to 90°. MTJ memory cell 10 at such a state is referred to as the "reference state." Then, while MTJ memory cell 10 is in the reference state as just described, control circuit 42 causes current driver 28 to apply the second read current $I_{R2}$ from ferromagnetic free layer 12 to ferromagnetic reference layer 14. The voltage $V_{BL2}$ generated by second read current $I_{R2}$ is stored by voltage storage device 34.

Next, at step 56, the external magnetic field is terminated by removing the corresponding applied current. In response, MTJ memory cell 10 will automatically switch back to its original data state. Then, at step 58, differential sense amplifier 38 is used to compare the two voltages ($V_{BL1}$ and $V_{BL2}$) on the two capacitors 30, 34, with the output being provided to control circuit 42.

Based on the output, control circuit 42 is able to determine the data state of MTJ memory cell 10. In particular, in the exemplary embodiment, the resistance state and thus the data state of MTJ memory cell 10 is determined as follows: (i) if $V_{BL1} > V_{BL2}$, then the data state is determined to be "1", which means the original resistance is $R_{high}$, and the intermediate resistance will be a certain value between ($R_{high}$+ $R_{low}$)/2 and $R_{high}$; and (ii) If $V_{BL1} < V_{BL2}$, then the data state is determined to be "0", which means the original resistance is $R_{low}$, and the intermediate resistance will be a certain value between $R_{low}$ and ($R_{high}$+$R_{low}$)/2.

Furthermore, the difference between $V_{BL1}$ and $V_{BL2}$, also called the sense margin, is determined by the switched magnetic angle of ferromagnetic free layer 12 after applying the external magnetic field. In the exemplary embodiment, care is taken to ensure that the angle does not exceed 90 degree to avoid data flipping. However, the more the angle approaches 90° degree, the larger the sense margin.

Figure 1B:
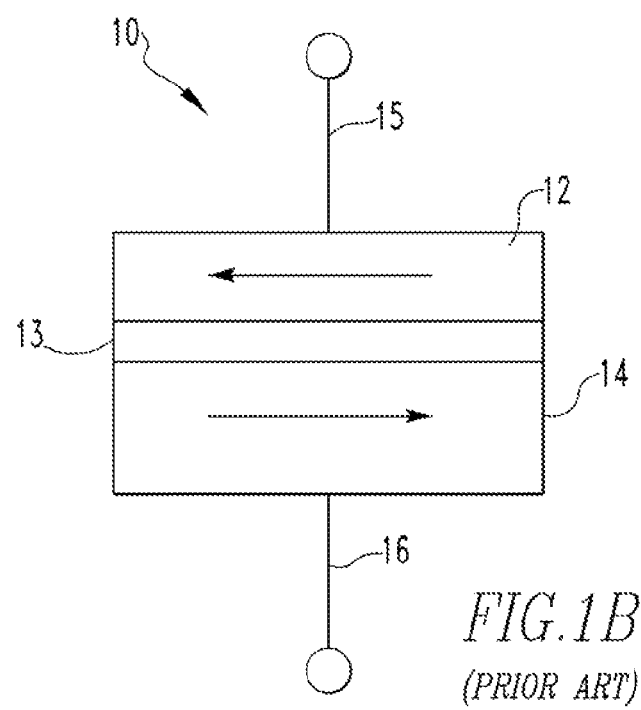

Thus, the disclosed self-reference reading method delivers high tolerance against process variations, provides a high sense margin, and reduces the read error probability and the cost of error correction. As shown in FIG. 1 shows, the extra overhead required to achieve this is only one additional metal layer during fabrication. The concepts described herein can be adapted to on-chip or stand-alone STT-RAM designs to improve the yield.

In the embodiments described above, the exemplary magnetic memory cell is in the form an MTJ. It will be understood, however, that other magnetic memory cell implementations having a ferromagnetic free layer and a ferromagnetic reference layer are also possible within the scope of the present invention. For example, the magnetic memory cell may also be in the form of what is known as a spin valve which comprises a ferromagnetic free layer and a ferromagnetic reference layer separated by either nothing or a metallic layer.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A method of reading a memory cell of a magnetoresistive random access memory device, the memory cell having a ferromagnetic free layer having a first magnetization orientation and a ferromagnetic reference layer, comprising:
    applying a first read current from the ferromagnetic free layer to the ferromagnetic reference layer and storing a first voltage generated by the memory cell in response to the first read current;
    generating a magnetic field adjacent to the memory cell, the magnetic field having a second magnetization orientation that is not parallel to the first magnetization orientation;
    while the magnetic field is being generated, applying a second read current from the ferromagnetic free layer to the ferromagnetic reference layer and storing a second voltage generated by the memory cell in response to the second read current;
    terminating the magnetic field after the second voltage is stored; and
    determining a state of the memory cell based on the first voltage and the second voltage.

2. The method according to claim 1, wherein the first voltage is a first bit line voltage formed by the first read current and the second voltage is a second bit line voltage formed by the second read current.

3. The method according to claim 1, wherein the memory cell includes a contact coupled to the ferromagnetic free layer and a magnetic field generating element coupled to the contact, wherein the generating the magnetic field adjacent to the memory cell comprises applying a magnetic field generating current to the magnetic field generating element.

4. The method according to claim 3, wherein the magnetic field generating element comprises a conductive wire or trace provided on top of the contact.

5. The method according to claim 1, wherein the second magnetization orientation is substantially orthogonal to the first magnetization orientation.

6. The method according to claim 5, wherein, prior to the magnetic field being generated, the memory cell is structured to have an original resistance state that is either a first resistance state $R_{high}$ indicative of a first binary state being stored in the memory cell or a second resistance state $R_{low}$ indicative of a second binary state being stored in the memory cell, wherein, responsive to the magnetic field being generated, the memory cell is structured to have an intermediate resistance state, wherein the first voltage is a first bit line voltage formed by the first read current and the second voltage is a second bit line voltage formed by the second read current, wherein the determining the state of the memory cell based on the first voltage and the second voltage comprises: (i) determining that the state is the first binary state responsive to the first voltage being greater than the second voltage, which means the original resistance state is $R_{high}$ and the intermediate resistance state is a value between $(R_{high}+R_{low})/2$ and $R_{high}$, and (ii) determining that the state is the second binary state responsive to the first voltage being less than the second voltage, which means the original resistance state is $R_{low}$ and the intermediate resistance state is a value between $R_{low}$ and $(R_{high}+R_{low})/2$.

7. The method according to claim 1, wherein the memory cell comprises a magnetic tunneling junction wherein an insulating barrier layer is provided between the ferromagnetic free layer and the ferromagnetic reference layer.

8. The method according to claim 1, wherein, prior to the magnetic field being generated, the memory cell is structured to have an original resistance state that is either a first resistance state $R_{high}$ indicative of a first binary state being stored in the memory cell or a second resistance state $R_{low}$ indicative of a second binary state being stored in the memory cell, wherein, responsive to the magnetic field being generated, the memory cell is structured to have an intermediate resistance state, wherein the first voltage is a first bit line voltage formed by the first read current and the second voltage is a second bit line voltage formed by the second read current, wherein the determining the state of the memory cell based on the first voltage and the second voltage comprises: (i) determining that the state is the first binary state responsive to the first voltage being greater than the second voltage, which means the original resistance state is $R_{high}$ and the intermediate resistance state is a value between $(R_{high}+R_{low})/2$ and $R_{high}$, and (ii) determining that the state is the second binary state responsive to the first voltage being less than the second voltage, which means the original resistance state is $R_{low}$ and the intermediate resistance state is a value between $R_{low}$ and $(R_{high}+R_{low})/2$.

9. A magneto-resistive random access memory device, comprising:
 a memory cell having (i) a ferromagnetic free layer having a first magnetization orientation, (ii) a ferromagnetic reference layer coupled to the ferromagnetic free layer, (iii) a contact coupled to the ferromagnetic free layer, and (iv) a magnetic field generating element coupled to the contact, wherein the magnetic field generating element is structured to generate a magnetic field having a second magnetization orientation that is not parallel to the first magnetization orientation in response to a magnetic field generating current being applied to the magnetic field generating element;
 a first energy storage device structured to store a first voltage generated in response to a first read current being applied to the memory cell while the magnetic field having the second magnetization orientation is not being generated;
 a second energy storage device structured to store a second voltage generated in response to a second read current being applied to the memory cell while the magnetic field having the second magnetization orientation is being generated; and
 a control circuit structured to determine a state of the memory cell based on the first voltage and the second voltage, wherein the control circuit is structured to: (i) cause the first read current to be applied to the memory cell, (ii) responsive to the first read current being applied to the memory cell, cause the first voltage to be stored in the first energy storage device, (iii) after the first voltage is stored in the first energy storage device, cause the magnetic field generating current to be applied to the magnetic field generating element, (iv) while the magnetic field generating current is being applied to the magnetic field generating element, cause the second read current to be applied to the memory cell, (v) responsive to the second read current being applied to the memory cell, cause the second voltage to be stored in the stored energy storage device, and (vi) after the second voltage is stored in the second energy storage device, determine the state of the memory cell based on the first voltage and the second voltage, and wherein the control circuit is further structured to cause the magnetic field generating current to be terminated after the second voltage is stored in the second energy storage device.

10. The magneto-resistive random access memory device according to claim 9, further comprising a differential sense amplifier coupled to the first and second energy storage devices and structured to generate a signal representing a difference between the first voltage and the second voltage, wherein the control circuit is structured to determine the state of the memory cell based on the signal.

11. The magneto-resistive random access memory device according to claim 9, wherein the first energy storage device is a first capacitor and the second energy storage device is a second capacitor.

12. The magneto-resistive random access memory device according to claim 9, wherein the memory cell comprises a magnetic tunneling junction wherein an insulating barrier layer is provided between the ferromagnetic free layer and the ferromagnetic reference layer.

13. The magneto-resistive random access memory device according to claim 9, wherein the first voltage is a first bit line voltage formed by the first read current and the second voltage is a second bit line voltage formed by the second read current.

14. The magneto-resistive random access memory device according to claim 9, wherein the magnetic field generating element comprises a conductive wire or trace provided on top of the contact.

15. The magneto-resistive random access memory device according to claim 9, wherein the second magnetization orientation is substantially orthogonal to the first magnetization orientation.

16. The magneto-resistive random access memory device according to claim 15, wherein, prior to the magnetic field being generated, the memory cell is structured to have an original resistance state that is either a first resistance state $R_{high}$ indicative of a first binary state being stored in the memory cell or a second resistance state $R_{low}$ indicative of a second binary state being stored in the memory cell, wherein, responsive to the magnetic field being generated, the memory cell is structured to have an intermediate resistance state, wherein the first voltage is a first bit line voltage formed by the first read current and the second voltage is a second bit line voltage formed by the second read current, wherein the control circuit is structured to determine the state of the memory cell based on the first voltage and the second voltage by: (i) determining that the state is the first binary state responsive to the first voltage being greater than the second voltage, which means the original resistance state is $R_{high}$ and the intermediate resistance state is a value between $(R_{high}+R_{low})/2$ and $R_{high}$, and (ii) determining that the state is the second binary state responsive to the first voltage being less than the second voltage, which means the original resistance state is $R_{low}$ and the intermediate resistance state is a value between $R_{low}$ and $(R_{high}+R_{low})/2$.

17. The magneto-resistive random access memory device according to claim 9, wherein, prior to the magnetic field being generated, the memory cell is structured to have an original resistance state that is either a first resistance state $R_{high}$ indicative of a first binary state being stored in the memory cell or a second resistance state $R_{low}$ indicative of a second binary state being stored in the memory cell, wherein, responsive to the magnetic field being generated, the memory cell is structured to have an intermediate resistance state, wherein the first voltage is a first bit line voltage formed by the first read current and the second voltage is a second bit line voltage formed by the second read current, wherein the control circuit is structured to determine the state of the memory cell based on the first voltage and the second voltage by: (i) determining that the state is the first binary state responsive to the first voltage being greater than the second voltage, which means the original resistance state is $R_{high}$ and the intermediate resistance state is a value between $(R_{high}+R_{low})/2$ and $R_{high}$, and (ii) determining that the state is the second binary state responsive to the first voltage being less than the second voltage, which means the original resistance state is $R_{low}$ and the intermediate resistance state is a value between $R_{low}$ and $(R_{high}+R_{low})/2$.

\* \* \* \* \*